United States Patent
Hou et al.

(10) Patent No.: US 11,709,291 B2
(45) Date of Patent: Jul. 25, 2023

(54) FIBERGLASS COMPOSITE COVER FOR FOLDABLE ELECTRONIC DISPLAY AND METHODS OF MAKING THE SAME

(71) Applicant: CORNING INCORPORATED, Corning, NY (US)

(72) Inventors: Jun Hou, Painted Post, NY (US); Kuan-Ting Kuo, Chubei (TW); Kevin Robert McCarthy, Horseheads, NY (US); Robert Lee Smith, III, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 150 days.

(21) Appl. No.: 16/965,218

(22) PCT Filed: Jan. 25, 2019

(86) PCT No.: PCT/US2019/015116
§ 371 (c)(1),
(2) Date: Jul. 27, 2020

(87) PCT Pub. No.: WO2019/147915
PCT Pub. Date: Aug. 1, 2019

(65) Prior Publication Data
US 2020/0371273 A1 Nov. 26, 2020

Related U.S. Application Data

(60) Provisional application No. 62/621,686, filed on Jan. 25, 2018.

(51) Int. Cl.
*B32B 7/14* (2006.01)
*G02B 1/111* (2015.01)
(Continued)

(52) U.S. Cl.
CPC .............. *G02B 1/111* (2013.01); *B32B 5/024* (2013.01); *B32B 7/14* (2013.01); *B32B 17/04* (2013.01);
(Continued)

(58) Field of Classification Search
CPC ... B32B 17/04; B32B 17/06; B32B 2262/101; B32B 2307/536; B32B 2307/584;
(Continued)

(56) References Cited

U.S. PATENT DOCUMENTS

| | | |
|---|---|---|
| 8,312,739 B2 | 11/2012 | Lee et al. |
| 8,561,429 B2 | 10/2013 | Allan et al. |

(Continued)

FOREIGN PATENT DOCUMENTS

| | | |
|---|---|---|
| JP | 2010-221441 A | 10/2010 |
| JP | 2011-104929 A | 6/2011 |

(Continued)

OTHER PUBLICATIONS

International Search Report and Written Opinion of the International Searching Authority; PCT/US2019/015116; dated Apr. 23, 2019; 11 Pages; European Patent Office.

(Continued)

*Primary Examiner* — Lawrence D Ferguson
(74) *Attorney, Agent, or Firm* — Jeffrey A. Schmidt

(57) ABSTRACT

Optically transparent fiber glass cover substrates for electronic displays. The cover substrates include an optically transparent fiberglass composite layer including a fiberglass layer embedded in a matrix material and an optically transparent hard-coat layer bonded to a top surface of the optically transparent fiberglass composite layer. A bottom surface of the optically transparent fiberglass composite layer may define a bottommost exterior surface of a cover substrate. The bottommost exterior surface of a cover sub- (Continued)

strate may be disposed over a display surface of an electronic display to protect the display surface from damage.

11 Claims, 11 Drawing Sheets

(51) Int. Cl.

| | | |
|---|---|---|
| G02B 1/14 | (2015.01) | |
| B32B 5/02 | (2006.01) | |
| B32B 17/04 | (2006.01) | |
| B32B 27/28 | (2006.01) | |
| H10K 50/84 | (2023.01) | |
| G02B 1/115 | (2015.01) | |
| H04M 1/02 | (2006.01) | |

(52) U.S. Cl.
CPC .............. *B32B 27/281* (2013.01); *G02B 1/14* (2015.01); *H10K 50/84* (2023.02); *B32B 2262/101* (2013.01); *B32B 2307/536* (2013.01); *B32B 2307/584* (2013.01); *B32B 2457/206* (2013.01); *G02B 1/115* (2013.01); *H04M 1/0268* (2013.01)

(58) Field of Classification Search
CPC ........ B32B 2307/732; B32B 2457/206; B32B 27/281; B32B 5/024; B32B 7/12; B32B 7/14; C03C 25/285; G02B 1/111; G02B 1/115; G02B 1/14; H01L 51/5237; H04M 1/0268
See application file for complete search history.

(56) References Cited

U.S. PATENT DOCUMENTS

| | | |
|---|---|---|
| 9,110,230 B2 | 8/2015 | Koch et al. |
| 9,272,947 B2 | 3/2016 | Baca et al. |
| 9,328,016 B2 | 5/2016 | Paulson |
| 9,335,444 B2 | 5/2016 | Hart et al. |
| 9,359,261 B2 | 6/2016 | Bellman et al. |
| 9,481,147 B2 | 11/2016 | Kaku et al. |
| 2010/0246016 A1 | 9/2010 | Carlson et al. |
| 2011/0062849 A1 | 3/2011 | Carlson et al. |
| 2011/0206903 A1 | 8/2011 | Mazumder |
| 2011/0267697 A1 | 11/2011 | Kohli et al. |
| 2011/0267698 A1 | 11/2011 | Guilfoyle et al. |
| 2012/0034435 A1 | 2/2012 | Borrelli et al. |
| 2012/0281292 A1 | 11/2012 | Baca et al. |
| 2013/0130004 A1 | 5/2013 | Milia et al. |
| 2015/0118276 A1 | 4/2015 | Borrelli et al. |
| 2015/0198752 A1 | 7/2015 | Lander et al. |
| 2020/0190277 A1 | 6/2020 | Hou et al. |
| 2020/0299471 A1 | 9/2020 | Hou et al. |

FOREIGN PATENT DOCUMENTS

| | | |
|---|---|---|
| WO | 2013/082477 A2 | 6/2013 |
| WO | 2013/082488 A2 | 6/2013 |
| WO | 2013/106629 A2 | 7/2013 |
| WO | 2013/106638 A1 | 7/2013 |
| WO | 2015/122485 A1 | 8/2015 |
| WO | 2017/123899 A1 | 7/2017 |

OTHER PUBLICATIONS

Moxbii, "Metearmor: World's First 9H Anti-Shock Screen Protector", available online at <https://www.moxbii.com/metearmor/>, retrieved on Nov. 16, 2017, 11 pages.

700

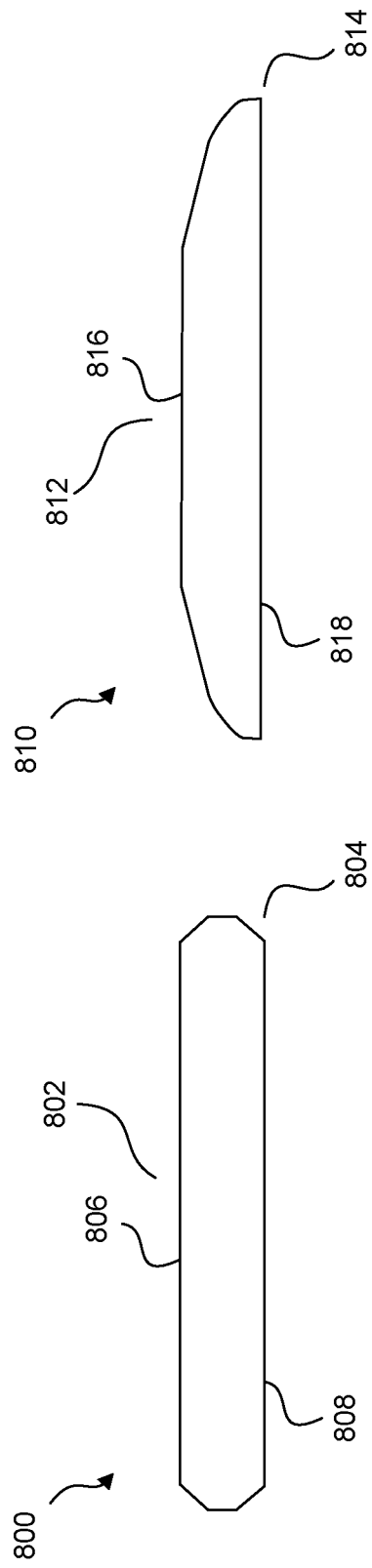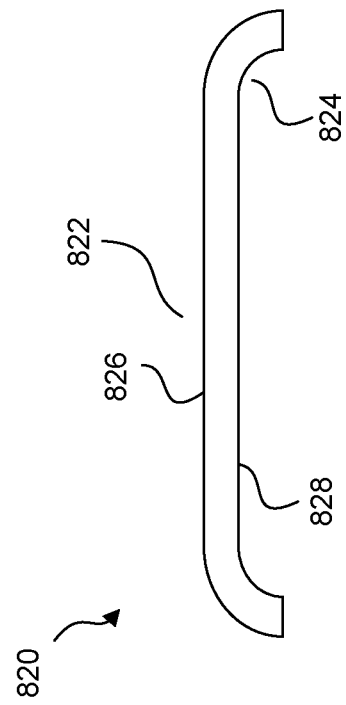

FIBERGLASS COMPOSITE COVER FOR FOLDABLE ELECTRONIC DISPLAY AND METHODS OF MAKING THE SAME

CROSS-REFERENCE TO RELATED APPLICATIONS

This application is a national stage entry of International Patent Application Serial No. PCT/US2019/015116, filed on Jan. 25, 2019, which in turn, claims the benefit of priority under 35 U.S.C. § 119 of U.S. Provisional Application Ser. No. 62/621,686 filed on Jan. 25, 2018, the contents of each of which are relied upon and incorporated herein by reference in their entireties.

BACKGROUND

Field

The present disclosure relates to fiberglass composite cover substrates. In particular, the present disclosure relates to optically transparent fiberglass cover substrates for displays.

Background

A cover substrate for a display of an electronic device protects a display screen and provides an optically transparent surface through which a user can view the display screen. Recent advancements in electronic devices (e.g., handheld and wearable devices) are trending towards lighter devices with improved reliability. The weight of different components of these devices, including protective components, such as cover substrates, have been reduced to create lighter devices.

Further, flexible cover substrates have been developed to compliment flexible and foldable display screens. However, when increasing the flexibility of a cover substrate, other characteristics of the cover substrate may be sacrificed. For example, increasing flexibility may in some situations, increase weight, reduce optical transparency, reduce scratch resistance, reduce puncture resistance, and/or reduce thermal durability, all of which can lead to visible damage to the cover substrate and/or failure of the display and/or device.

Plastic films may have good flexibility but suffer from poor mechanical durability. Polymer films with hard coatings have shown improved mechanical durability but often result in higher manufacturing costs and reduced flexibility. Thin monolithic glass solutions have excellent scratch resistance, but meeting the flexibility and puncture resistance metrics at the same time has been a challenge. Ultra-thin glass can have a good bend radius but may suffer from reduced puncture resistance.

Therefore, a continuing need exists for innovations in cover substrates for consumer products, such as cover substrates for protecting a display screen. And in particular, cover substrates for consumer devices including a flexible component, such as a flexible display screen.

BRIEF SUMMARY

The present disclosure is directed to cover substrates, for example flexible cover substrates for protecting a flexible or sharply curved component, such as a display component. These cover substrates include a fiberglass composite layer and a hard-coat layer that do not negatively affect the flexibility or curvature of the component while also protecting the component from damaging mechanical forces. The flexible cover substrate may include a flexible, optically transparent fiberglass composite layer and an optically transparent hard-coat layer.

Some embodiments are directed to a cover substrate for an electronic display, the cover substrate including an optically transparent fiberglass composite layer including a fiberglass layer embedded in a matrix material and bottom surface defining a bottommost exterior surface of the cover substrate, and an optically transparent hard-coat layer bonded to a top surface of the optically transparent fiberglass composite layer.

Some embodiments are directed to an article including a cover substrate including an optically transparent fiberglass composite layer including a bottom surface defining a bottommost surface of the cover substrate, and an optically transparent hard-coat layer bonded to a top surface of the optically transparent fiberglass composite layer.

In some embodiments, the article according to the preceding paragraph may be a consumer electronic product, the consumer electronic product including a housing having a front surface, a back surface and side surfaces, electrical components at least partially disposed within the housing, the electrical components including a controller, a memory, and a display at or adjacent to the front surface of the housing, and the cover substrate, where the cover substrate is disposed over the display or forms at least a portion of the housing.

In some embodiments, the cover substrate according to embodiments of any of the preceding paragraphs may include an optically transparent adhesive layer disposed on the optically transparent fiberglass composite layer and bonding the optically transparent hard-coat layer to the optically transparent fiberglass composite layer. In some embodiments, the optically transparent adhesive layer comprises a thickness in a range of 5 micrometers ($\mu m$, microns) to 50 microns.

In some embodiments, the fiberglass layer of the optically transparent fiberglass composite layer according to embodiments of any of the preceding paragraphs may comprise a glass material having a first refractive index and the matrix material of the optically transparent fiberglass composite layer may have a second refractive index, and a difference between the first refractive index and the second refractive index is 0.05 or less.

In some embodiments, the fiberglass layer of the optically transparent fiberglass composite layer according to embodiments of any of the preceding paragraphs may be a woven fiberglass layer.

In some embodiments, the matrix material of the optically transparent fiberglass composite layer according to embodiments of any of the preceding paragraphs may include a cross-linked polymer material.

In some embodiments, the optically transparent fiberglass composite layer according to embodiments of any of the preceding paragraphs may have a thickness in a range of 25 microns to 200 microns.

In some embodiments, the fiberglass layer of the optically transparent fiberglass composite layer according to embodiments of any of the preceding paragraphs may have a thickness in a range of 10 microns to 100 microns.

In some embodiments, the optically transparent hard-coat layer according to embodiments of any of the preceding paragraphs may have a pencil hardness of 8H or more.

In some embodiments, the optically transparent hard-coat layer according to embodiments of any of the preceding paragraphs may be a polymeric layer.

In some embodiments, the cover substrate according to embodiments of any of the preceding paragraphs may have a bend radius of 3 mm or less.

In some embodiments, a topmost exterior surface of the cover substrate according to embodiments of any of the preceding paragraphs may include a substantially flat central area and a curved peripheral area disposed around all or portion of the substantially flat central area.

In some embodiments, the optically transparent fiberglass composite layer according to embodiments of any of the preceding paragraphs may have an elastic modulus in a range of 200 MPa to 2500 MPa.

In some embodiments, the optically transparent fiberglass composite layer according to embodiments of any of the preceding paragraphs has a first refractive index and the optically transparent hard-coat layer according to embodiments of any of the preceding paragraphs has a second refractive index, and a difference between the first refractive index and the second refractive index is 0.05 or less.

In some embodiments, the cover substrate according to embodiments of any of the preceding paragraphs may have an impact resistance defined by the capability of the cover substrate to avoid failure at a minimum pen drop height in a Pen Drop Test, the minimum pen drop height being 7 centimeters.

Some embodiments are directed to an electronic display component including an electronic display including a display surface, and a cover substrate disposed over the display surface, the cover substrate including an optically transparent fiberglass composite layer disposed over the display surface and an optically transparent hard-coat layer bonded to a top surface of the optically transparent fiberglass composite layer.

In some embodiments, the electronic display according to the embodiment of the preceding paragraph nay be a flexible electronic display.

In some embodiments, the cover substrate according to the embodiment of the preceding paragraph is configured to protect the flexible electronic display from impact forces and the cover substrate has an impact resistance defined by the capability of the cover substrate to avoid failure at a minimum pen drop height in a Pen Drop Test, the minimum pen drop height being 7 centimeters.

In some embodiments, the electronic display component according to embodiments of any of three preceding paragraphs may include an optically transparent adhesive layer disposed on the display surface of the electronic display and bonding the optically transparent fiberglass composite layer to the display surface.

In some embodiments, the electronic display component according to embodiments of any of the four preceding paragraphs may be devoid of a glass layer disposed between the display surface and the optically transparent fiberglass composite layer.

Some embodiments are directed to a method of making a cover substrate for an electronic display, the method including forming an optically transparent fiberglass composite layer including a fiberglass layer embedded in a matrix material and bottom surface defining a bottommost exterior surface of the cover, and bonding an optically transparent hard-coat layer to a top surface of the optically transparent fiberglass composite layer.

In some embodiments, the method according to the embodiment of the preceding paragraph may include bonding the optically transparent hard-coat layer to the top surface of the optically transparent composite layer with an optically transparent adhesive layer. In some embodiments, the method according to the embodiment of the preceding paragraph may include forming the optically transparent hard-coat layer on the top surface of the optically transparent fiberglass composite layer, and forming the optically transparent hard-coat layer on the top surface bonds the optically transparent hard-coat layer to the top surface.

BRIEF DESCRIPTION OF THE DRAWINGS

The accompanying figures, which are incorporated herein, form part of the specification and illustrate embodiments of the present disclosure. Together with the description, the figures further serve to explain the principles of and to enable a person skilled in the relevant art(s) to make and use the disclosed embodiments. These figures are intended to be illustrative, not limiting. Although the disclosure is generally described in the context of these embodiments, it should be understood that it is not intended to limit the scope of the disclosure to these particular embodiments.

In the drawings, like reference numbers indicate identical or functionally similar elements.

FIGS. 8A-8C illustrate cover substrates according to various embodiments.

DETAILED DESCRIPTION

Figure 1:
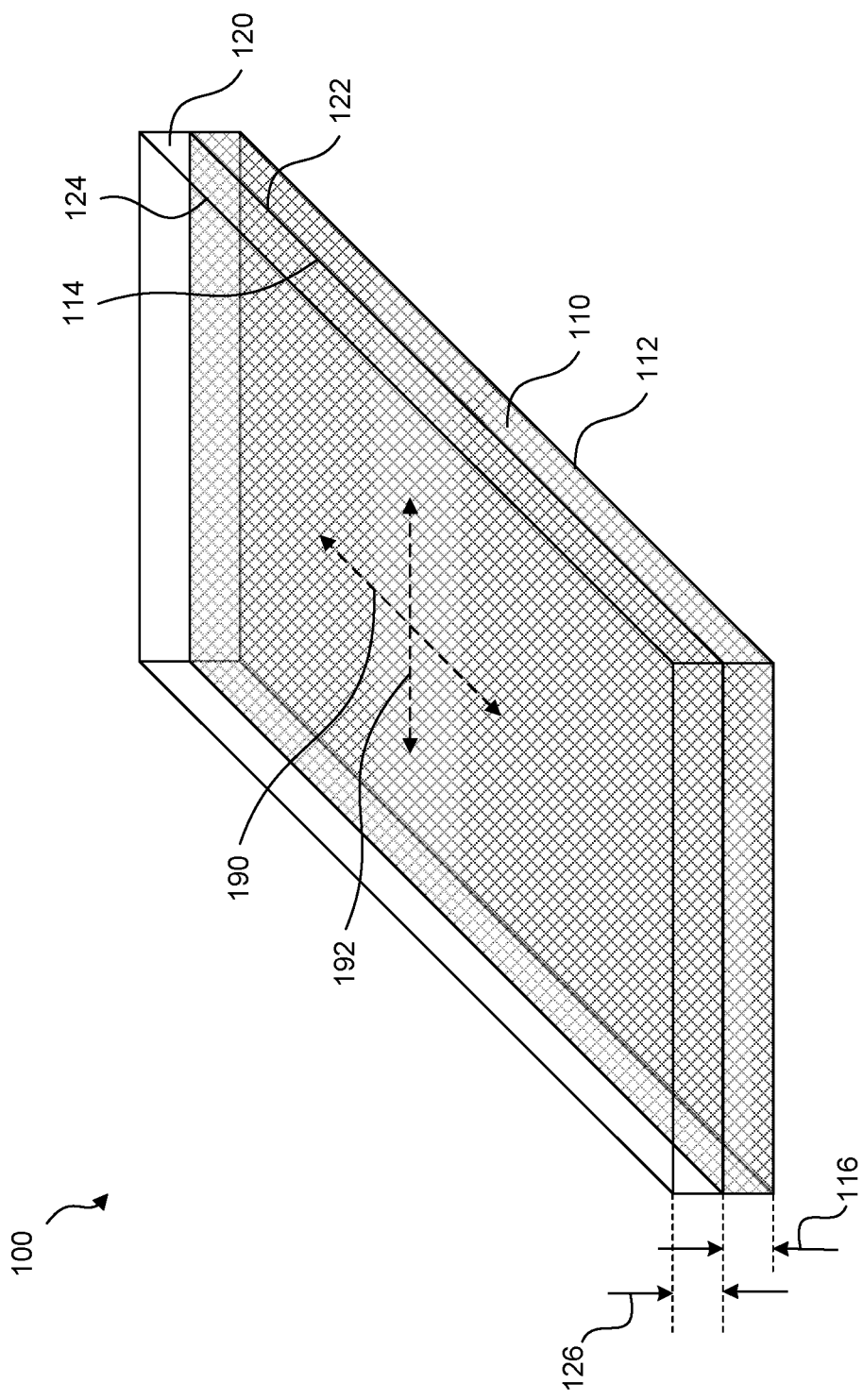
FIG. 1 illustrates a cover substrate according to some embodiments.

The following examples are illustrative, but not limiting, of the present disclosure. Other suitable modifications and adaptations of the variety of conditions and parameters normally encountered in the field, and which would be apparent to those skilled in the art, are within the spirit and scope of the disclosure.

Cover substrates for consumer products may serve to, among other things, reduce undesired reflections, prevent formation of mechanical defects in the cover substrate (e.g., scratches or cracks), and/or provide an easy to clean transparent surface. The cover substrates disclosed herein may be incorporated into another article such as an article with a display (or display articles) (e.g., consumer electronic products, including mobile phones, tablets, computers, navigation systems, wearable devices (e.g., watches) and the like), architectural articles, transportation articles (e.g., automotive, trains, aircraft, sea craft, etc.), appliance articles, or any article that may benefit from some transparency, scratch-resistance, abrasion resistance, or a combination thereof. An exemplary article incorporating any of the cover substrates disclosed herein is a consumer electronic device including a housing having front, back, and side surfaces; electrical components that are at least partially inside or entirely within the housing and including at least a controller, a memory, and a display at or adjacent to the front surface of the housing; and a cover substrate at or over the front surface of the housing such that it is over the display. The cover substrate may include any of the cover substrates disclosed herein. In some embodiments, at least one of a portion of the housing or the cover substrate comprises a cover substrate disclosed herein.

Cover substrates also serve to protect sensitive components of a consumer product from mechanical damage (e.g., puncture and impact forces). For consumer products including a flexible, foldable, and/or sharply curved portion (e.g., a flexible, foldable, and/or sharply curved display screen), a cover substrate for protecting the display screen should preserve the flexibility, foldability, and/or curvature of the screen while also protecting the screen. Moreover, the cover substrate should resist mechanical damage, such as scratches and fracturing, so that a user can enjoy an unobstructed view of the display screen.

Thick monolithic glass substrates may provide adequate mechanical properties, but these substrates can be bulky and incapable of folding to tighter radii in order to be utilized in foldable, flexible, or sharply curved consumer products. And highly flexible cover substrates, such a plastic substrates, may be unable to provide adequate puncture resistance, scratch resistance, and/or fracture resistance desirable for consumer products.

Cover substrates discussed herein include a composite fiberglass layer and a polymeric top layer (e.g., a hard-coat, or an anti-scratch layer) bonded to the composite fiberglass layer. In some embodiments, the polymeric top layer may be laminated to the composite fiberglass layer. The composite fiberglass layer may include a fiberglass layer and a refractive index-matched polymer matrix. Refractive index matching between the fiberglass layer material and the matrix material can provide desired optically transparency for the composite fiberglass layer.

The combination of a composite fiberglass layer and a polymeric top coat layer for a cover substrate as discussed herein can provide the mechanical properties desired to prevent scratch, puncture, and/or impact damage while providing the flexibility found in polymeric materials. And mechanical properties of the cover substrates discussed herein (e.g., stiffness) can be adjusted by changing, for example, the modulus of the composite fiberglass layer's matrix material and/or fiberglass density. Such adjustability may facilitate easy customization of cover substrates for different types of consumer products (e.g., different flexible and/or wearable electronic devices).

The cover substrates discussed herein provide a bendable and damage-resistant cover for flexible electronic devices by utilizing layers that combine a glass material's strength and a plastic material's bendability. This results in a flexible cover substrate with improved puncture and/or impact damage resistance when compared to cover substrates including a glass layer (e.g., an ultra-thin glass layer) and cover substrates formed of only plastic films and/or layers. And these beneficial properties can be combined while maintaining the capability of bending to small bend radius (e.g., about 3 millimeters (mm), 2 mm, or 1 mm). The net-like structure of fiberglass embedded in a matrix material provides a buffer to puncture impact by absorbing the impact force and spreading it over a large area. And the polymeric top layer may provide scratch resistance, and additional impact resistance and/or puncture resistance. In some embodiments, the polymeric top layer may be a polymeric hard-coat layer having a pencil hardness of 8H or more, for example or 9H or more. Pencil hardness is measured by according to ASTM D3363. The combination of the composite fiberglass layer and polymer top layer discussed herein can reduce the size of fractures formed during use a cover substrate compared to cover substrates including ultra-thin glass (i.e., glass having a thickness of 75 microns or less).

In some embodiments, for purposes of providing desirable mechanical properties, the cover substrate may include only a composite fiberglass layer bonded to a polymeric top layer. In such embodiments, this structure may reduce the number of layers to manufacture a flexible cover substrate capable of adequately protecting sensitive components of a consumer product from mechanical damage during use. By decreasing the number of layers to adequately protect sensitive components of a consumer product, the formation of stresses between layers of a cover substrate, which can contribute to failure of a cover substrate, may be reduced. Further, decreasing the number of layers eliminates any inflexibility added by additional layers. By building the desired mechanical properties into these two layers, the cover substrate can be manufactured at low cost and with low chance of failure.

FIG. 1 illustrates a cover substrate 100 according to some embodiments. Cover substrate 100 includes an optically transparent fiberglass composite layer 110 and an optically transparent hard-coat layer 120 bonded to the optically transparent fiberglass composite layer 110. In some embodiments, optically transparent hard-coat layer 120 may be bonded to top surface 114 of optically transparent fiberglass composite layer 110. In some embodiments, optically transparent hard-coat layer 120 may be disposed on top surface 114 of optically transparent fiberglass composite layer 110.

As used herein, "disposed on" means that a first layer is in direct contact with a second layer. A first layer "disposed on" a second layer may be deposited, formed, placed, or otherwise applied directly onto the second layer. In other words, if a first layer is disposed on a second layer, there are no layers disposed between the first layer and the second layer. A first layer described as "bonded to" a second layer means that the layers are bonded directly to each other, either by direct contact and/or bonding between the two layers or via an adhesive layer. For example, in some embodiments, optically transparent hard-coat layer 120 may be bonded to top surface 114 of optically transparent fiberglass composite layer 110 via an optically transparent adhesive (see e.g., optically transparent adhesive layer 130 in FIG. 2). As another example, optically transparent hard-coat layer 120 may be bonded to top surface 114 of optically transparent fiberglass composite layer 110 by forming or depositing optically transparent hard-coat layer 120 on optically transparent fiberglass composite layer 110. If a first layer is described as "disposed over" a second layer, other layers may or may not be present between the first layer and the second layer.

As used herein, "optically transparent" means an average transmittance of 70% or more in the wavelength range of 400 nm to 700 nm through a 1.0 mm thick piece of a material. In some embodiments, an optically transparent material may have an average transmittance of 75% or more, 80% or more, 85% or more, or 90% or more in the wavelength range of 400 nanometers (nm) to 700 nm through a 1.0 mm thick piece of the material. The average transmittance in the wavelength range of 400 nm to 700 nm is calculated by measuring the transmittance of all wavelengths from 400 nm to 700 nm, and averaging the measurements.

In some embodiments, a bottom surface 112 of optically transparent fiberglass composite layer 110 may define a bottommost exterior surface of cover substrate 100. In such embodiments, bottom surface 112 of optically transparent fiberglass composite layer 110 may be disposed over a display surface of an electronic display in use (e.g., display surface 514 shown in FIG. 5). In some embodiments, a top surface 124 of optically transparent hard-coat layer 120 may define a topmost exterior, user-facing surface of a cover substrate 100. As used herein, the terms "top surface" or "topmost surface" and "bottom surface" or "bottommost surface" reference the top and bottom surface of a layer or article as is would be oriented on a device during its normal and intended use with the top surface being the user-facing surface. For example, when incorporated into a hand-held consumer electronic product having an electronic display, the "top surface" of a cover substrate refers to the top surface of that cover substrate as it would be oriented when held by a user viewing the electronic display through the cover substrate.

In some embodiments, optically transparent fiberglass composite layer 110 may have a thickness 116, measured from bottom surface 112 to a top surface 114 of optically transparent fiberglass composite layer 110, in a range of 25 microns (micrometers) to 200 microns, including any and all sub-ranges between those end points. For example, thickness 116 may be 25 microns, 30 microns, 35 microns, 40 microns, 45 microns, 50 microns, 60 microns, 70 microns, 75 microns, 80 microns, 90 microns, 100 microns, 110 microns, 120 microns, 125 microns, 130 microns, 140 microns, 150 microns, 160 microns, 170 microns, 175 microns, 180 microns, 190 microns, 200 microns, or within a range having any two of these values as endpoints. For example thickness 116 may be from 25 microns to 190 microns, or from 25 microns to 180 microns, or from 25 microns to 170 microns, or from 25 microns to 160 microns, or from 25 microns to 150 microns, or from 25 microns to 140 microns, or from 25 microns to 130 microns, or from 25 microns to 120 microns, or from 25 microns to 110 microns, or from 25 microns to 100 microns, or from 25 microns to 90 microns, or from 25 microns to 80 microns, or from 25 microns to 70 microns, or from 25 microns to 60 microns, or from 25 microns to 50 microns, or from 25 microns to 40 microns.

In some embodiments, optically transparent fiberglass composite layer 110 may have an elastic modulus, measured in a first lateral direction 190 and/or a second lateral direction 192 parallel to top surface 114 of optically transparent fiberglass composite layer 110, of 200 MPa (Megapascals) or more. In some embodiments, optically transparent fiberglass composite layer 110 may have an elastic modulus in first lateral direction 190 and/or second lateral direction 192 in a range of 200 MPa to 2500 MPa, including any and all sub-ranges between those end points. For example, optically transparent fiberglass composite layer 110 may have an elastic modulus in first lateral direction 190 and/or second lateral direction 192 of 200 MPa, 250 MPa, 300 MPa, 400 MPa, 500 MPa, 600 MPa, 700 MPa, 750 MPa, 800 MPa, 900 MPa, 1000 MPa, 1100 MPa, 1200 MPa, 1300 MPa, 1400 MPa, 1500 MPa, 1600 MPa, 1700 MPa, 1800 MPa, 1900 MPa, 2000 MPa, 2100 MPa, 2200 MPa, 2300 MPa, 2400 MPa, 2500 MPa, or within any range having any two of these values as end points. For example, optically transparent fiberglass composite layer 110 may have an elastic modulus in first lateral direction 190 and/or second lateral direction 192 of 200 MPa to 2400 MPa, or from 200 MPa to 2300 MPa, or from 200 MPa to 2200 MPa, or from 200 MPa to 2100 MPa, or from 200 MPa to 2000 MPa, or from 200 MPa to 1900 MPa, or from 200 MPa to 1800 MPa, or from 200 MPa to 1700 MPa, or from 200 MPa to 1600 MPa, or from 200 MPa to 1500 MPa, or from 200 MPa to 1400 MPa, or from 200 MPa to 1300 MPa, or from 200 MPa to 1200 MPa, or from 200 MPa to 1100 MPa, or from 200 MPa to 1000 MPa, or from 200 MPa to 900 MPa, or from 200 MPa to 800 MPa, or from 200 MPa to 700 MPa, or from 200 MPa to 600 MPa, or from 200 MPa to 500 MPa, or from 200 MPa to 400 MPa. A relatively low elastic modulus (e.g., in a range of 200 MPa to 2500 MPa) in first lateral direction 190 and/or a second lateral direction 192 may minimize the force to a bend cover substrate, for example during use or manufacturing. Also, a relatively low elastic modulus may minimize internal stresses within a cover substrate. Internal stresses within a cover substrate can contribute to failure of the cover substrate during use and/or can be transferred to an attached display device and damage the display device.

In some embodiments, optically transparent fiberglass composite layer 110 may have an elastic modulus greater than 2500 MPa in first lateral direction 190 and/or second lateral direction 192. The orientation of fibers in optically transparent fiberglass composite layer 110 may be tailored to create desired elastic moduli in first lateral direction 190 and/or second lateral direction 192. In some embodiments, the elastic modulus in first lateral direction 190 and second lateral direction 192 may be the same. In some embodiments, the elastic modulus in first lateral direction 190 and second lateral direction 192 may be different (i.e., one may be less than or greater than the other).

Optically transparent hard-coat layer 120 may comprise an optically transparent material having a pencil hardness greater than the pencil hardness of optically transparent fiberglass composite layer 110. In some embodiments, optically transparent hard-coat layer 120 may comprise an optically transparent material having a pencil hardness of 8 H or more, or 9 H or more. In some embodiments, optically transparent hard-coat layer 120 may comprise an optically transparent polymer material. In some embodiments, optically transparent hard-coat layer 120 may comprise an optically transparent polymer material having a pencil hardness of 8 H or more, or 9 H or more.

Suitable materials for optically transparent hard-coat layer 120 include, but are not limited to, inorganic-organic hybrid polymeric materials and aliphatic or aromatic hexafunctional urethane acrylates. As used herein, "inorganic-organic hybrid polymeric material" means a polymeric material comprising monomers with inorganic and organic components. An inorganic-organic hybrid polymer is obtained by a polymerization reaction between monomers having an inorganic group and an organic group. An inorganic-organic hybrid polymer is not a nanocomposite material comprising separate inorganic and organic constituents or phases, such as for example inorganic particulate dispersed within an organic matrix.

In some embodiments, the inorganic-organic hybrid polymeric material may include polymerized monomers comprising an inorganic silicon-based group, for example, a silsesquioxane polymer. A silsesquioxane polymer may be, for example, an alky-silsesquioxane, an aryl-silsesquioxane, or an aryl alkyl-silsesquioxane having the following chemical structure: $(RSiO_{1.5})n$, wherein R is an organic group such as, but not limited to, methyl or phenyl. In some embodiments, optically transparent hard-coat layer 120 may be a silsesquioxane polymer layer manufactured by Gunze Limited and having a hardness of 9 H.

In some embodiments, optically transparent hard-coat layer 120 may be a layer comprising 90 weight percent (wt %) to 95 wt % of an aromatic hexafunctional acrylate (e.g., PU662NT (Aromatic hexafunctional acrylate) manufactured by Miwon Specialty Chemical Co.) and 10 wt % to 5 wt % photo-initiator (e.g., Darocur 1173 manufactured by Ciba Specialty Chemicals Corporation) with a hardness of 8 H or more. In some embodiments, an optically transparent hard-coat layer 120 comprising an aliphatic or aromatic hexafunctional urethane acrylate may be formed as a stand-alone layer by spin-coating the layer on a polyethylene terephthalate (PET) substrate, curing the urethane acrylate, and removing the urethane acrylate layer from the PET substrate.

Optically transparent hard-coat layer 120 may have a thickness 126, measured from a bottom surface 122 to a top surface 124 of optically transparent hard-coat layer 120, in a range of 10 microns to 120 microns, including any and all sub-ranges therebetween. For example, thickness 126 of optically transparent hard-coat layer 120 may be 10 microns, 20 microns, 30 microns, 40 microns, 50 microns, 60 microns, 70 microns, 80 microns, 90 microns, 100 microns, 110 microns, 120 microns, or within a range having any two of these values as endpoints. For example, thickness 126 may be from 10 microns to 110 microns, or from 10 microns to 100 microns, or from 10 microns to 90 microns, or from 10 microns to 80 microns, or from 10 microns to 70 microns, or from 10 microns to 60 microns, or from 10 microns to 50 microns, or from 10 microns to 40 microns, or from 10 microns to 30 microns, or from 10 microns to 20 microns.

Figure 2:
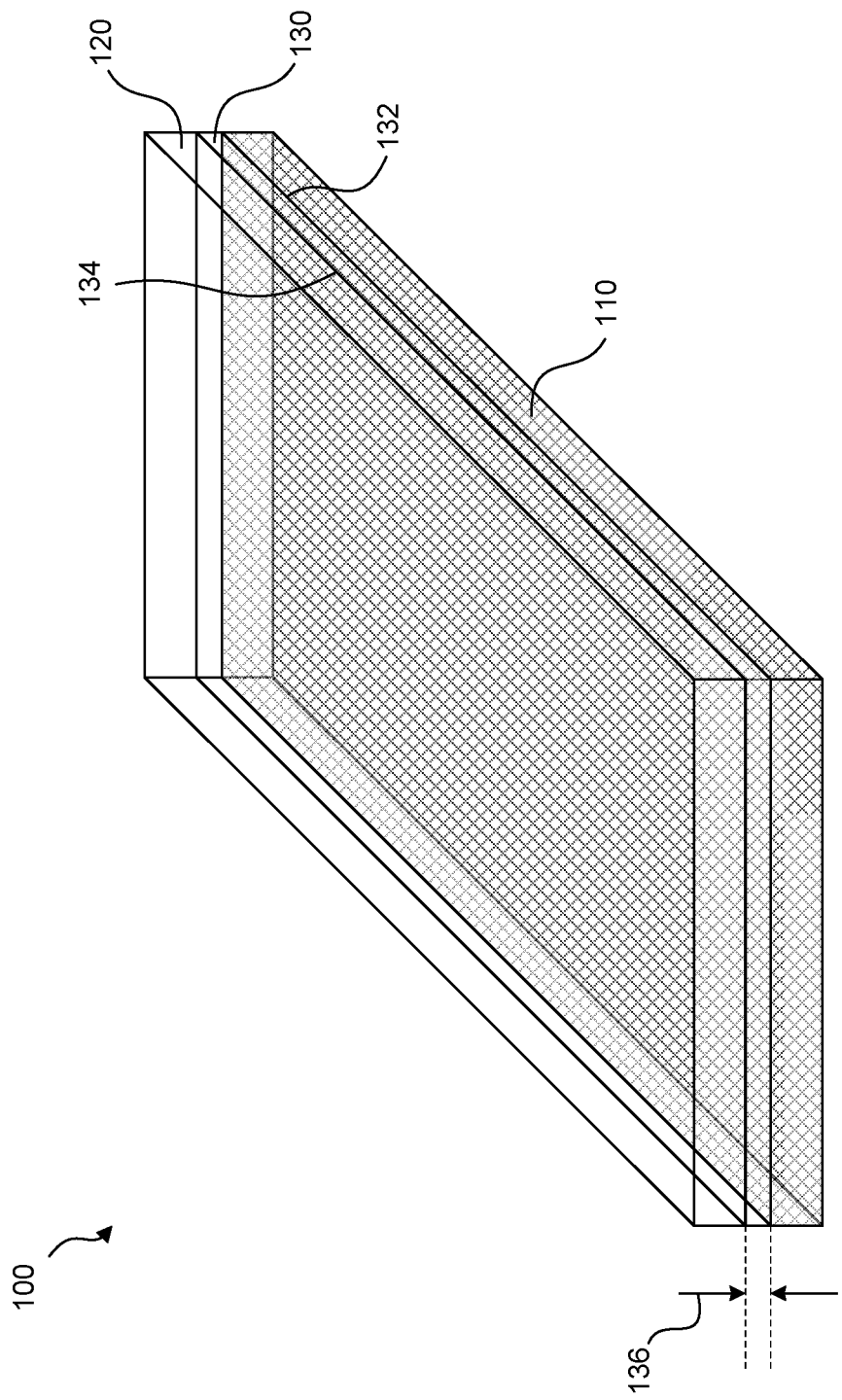
FIG. 2 illustrates a cover substrate according to some embodiments.

As shown for example in FIG. 2, in some embodiments, an optically transparent adhesive layer 130 may be disposed on top surface 114 of optically transparent fiberglass composite layer 110 to bond optically transparent hard-coat layer 120 to optically transparent fiberglass composite layer 110. Suitable optically transparent adhesives for layer 130 include, but are not limited to acrylic adhesives, such as 3M™ 8211 or 3M™ 821X adhesives, or any liquid optically transparent adhesive, such as a Loctite® liquid optically transparent adhesive.

Optically transparent adhesive layer 130 may have a thickness 136, measured from a bottom surface 132 to a top surface 134 of optically transparent adhesive layer 130, in a range of 5 microns to 50 microns, including any and all sub-ranges therebetween. For example, thickness 136 of optically transparent adhesive layer 130 may be 5 microns, 10 microns, 15 microns, 20 microns, 25 microns, 30 microns, 35 microns, 40 microns, 45 microns, 50 microns, or within a range having any two of these values as endpoints. In some embodiments, thickness 126 may be in a range of 5 microns to 45 microns, or from 5 microns to 40 microns, or from 5 microns to 35 microns, or from 5 microns to 30 microns, or from 5 microns to 25 microns, or from 5 microns to 20 microns, or from 5 microns to 15 microns, or from 5 microns to 10 microns.

Figure 3:
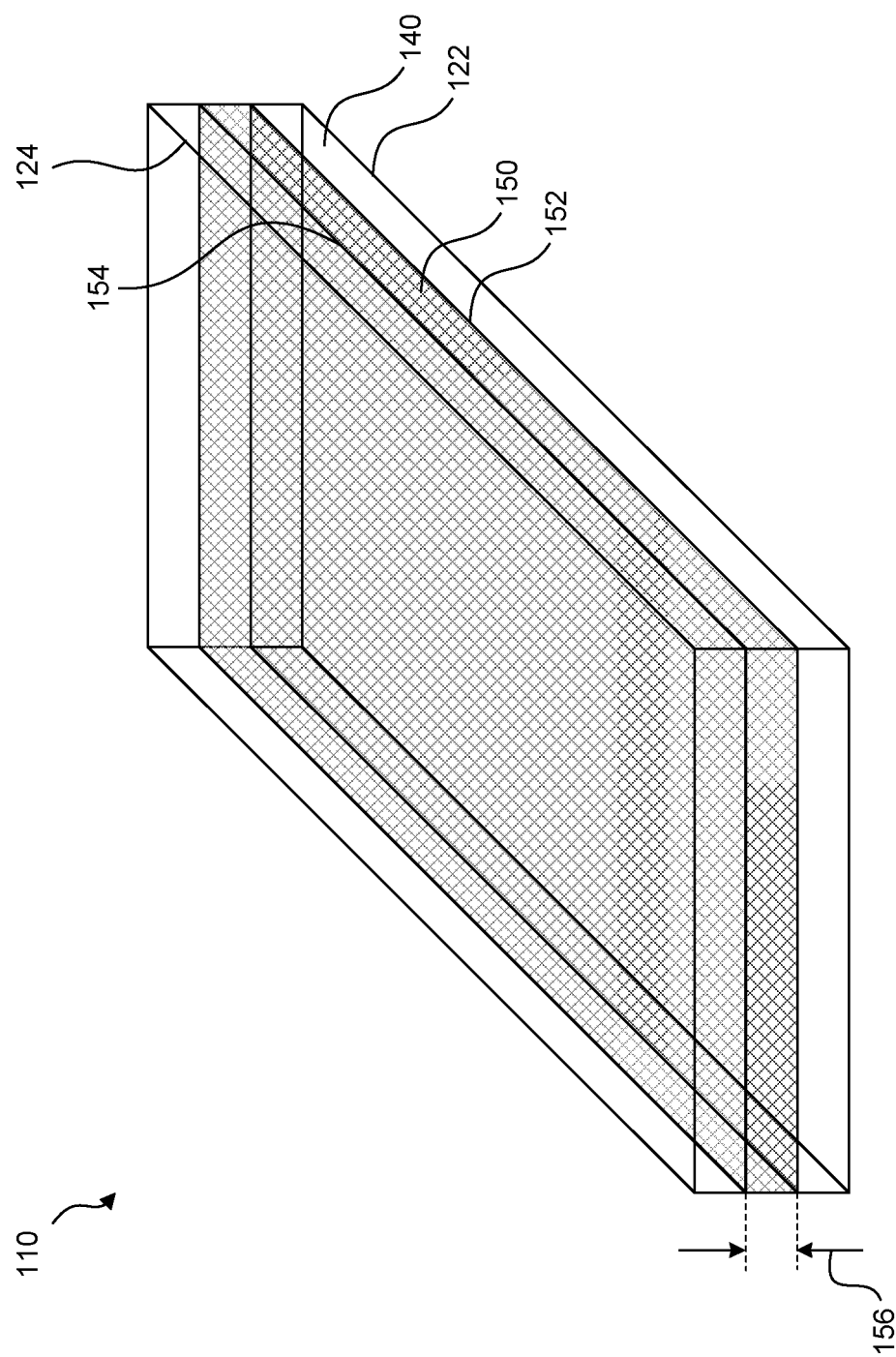
FIG. 3 illustrates an optically transparent fiberglass composite layer according to some embodiments.

As shown for example in FIG. 3, optically transparent fiberglass composite layer 110 may include a fiberglass layer 150 embedded in a matrix material 140. Suitable materials for matrix material 140 include but are not limited to, acrylate polymers. In some embodiments, these polymers may be cross-linked polymers. In some embodiments, optically transparent fiberglass composite layer 110 may comprise the same materials and made in the same fashion as optically transparent fiberglass composite layer 630 discussed herein.

Fiberglass layer 150 may include one or more layers of glass fibers or glass fiber tows arranged in an ordered pattern. In some embodiments, fiberglass layer 150 may include one or more woven fiberglass layers. A used herein, a "woven layer" means a layer having two or more sets of fibers or fiber tows oriented in different directions, with the different sets of fibers or fiber tows overlapping each other and interwoven with each other (for example, in an alternating, overlapping configuration). A woven layer includes an ordered arrangement of fiber or fiber tow sets across the layer. A woven layer, or any layer including fibers and/or tows arranged in an ordered pattern, does not include a significant amount of randomly oriented fibers or fibers tows. Suitable woven patterns for fiberglass layer 150 include, but are not limited to, a plain weave pattern, a twill weave pattern, a satin weave pattern, a jacquard pattern, and a leno weave pattern.

In some embodiments, fiberglass layer 150 may have an minimum density of fibers in a range of 500 to 1500 grams per meter squared ($g/m^2$), including any and all sub-ranges therebetween. For example, fiber glass layer 150 may have a minimum density of 500 $g/m^2$, 600 $g/m^2$, 700 $g/m^2$, 800 $g/m^2$, 900 $g/m^2$, 1000 $g/m^2$, 1100 $g/m^2$, 1200 $g/m^2$, 1300 $g/m^2$, 1400 $g/m^2$, 1500 $g/m^2$, or within a range having any two of these values as end points. For example fiber glass layer 150 may have a minimum density of from 500 $g/m^2$ to 1400 $g/m^2$, or from 500 $g/m^2$ to 1300 $g/m^2$, or from 500 $g/m^2$ to 1200 $g/m^2$, or from 500 $g/m^2$ to 1100 $g/m^2$, or from 500 $g/m^2$ to 1000 $g/m^2$, or from 500 $g/m^2$ to 900 $g/m^2$, or from 500 $g/m^2$ to 800 $g/m^2$, or from 500 $g/m^2$ to 700 $g/m^2$, or from 500 $g/m^2$ to 600 $g/m^2$. In some embodiments, the minimum density of fibers in fiberglass layer 150 may be about 1080 $g/m^2$. The density of fibers in fiberglass layer 150 may selected to provide desired mechanical properties for optically transparent fiberglass composite layer 110. In general, higher fiber densities for fiberglass layer 150 result in higher stiffness and impact and/or puncture resistance properties for optically transparent fiberglass composite layer 110, and vice versa.

Unless indicated otherwise, the density of fiberglass layer 150 as reported herein is measured in the absence of a matrix material (e.g., before fiberglass layer 150 is embedded within matrix material 140). As a practical matter, however, the density of fiberglass layer 150 may be measured after embedding fiberglass layer 150 into matrix material 140 by measuring the density of the embedded fiberglass layer 150 and factoring out the density of matrix material 140.

Fiberglass layer 150 may have a thickness 156, measured from a bottom surface 152 to a top surface 154 of fiberglass layer 150, in a range of 10 microns to 100 microns, including any and all sub-ranges therebetween. For example, thickness 156 may be 10 microns, 20 microns, 30 microns, 40 microns, 50 microns, 60 microns, 70 microns, 80 microns, 90 microns, 100 microns, or within a range having any two of these values as endpoints. For example, thickness 156 may be 10 microns to 90 microns, or from 10 microns to 80 microns, or from 10 microns to 70 microns, or from 10 microns to 60 microns, or from 10 microns to 50 microns, or from 10 microns to 40 microns, or from 10 microns to 30 microns, or from 10 microns to 20 microns.

In some embodiments, fiberglass layer 150 and matrix material 140 may be refractive index-matched materials. In such embodiments, fiberglass layer 150 includes fibers comprising a glass material having a first refractive index and matrix material 140 has a second refractive index, and a difference between the first refractive index and the second refractive index (Δn) is 0.05 or less. In some embodiments, Δn may be 0.04 or less. In some embodiments, Δn may be 0.03 or less. In some embodiments, the refractive index of the glass material for fiberglass layer 150 may be in a range of 1.5 to 1.6, including any and all sub-ranges therebetween. For example, the refractive index of the glass material may be 1.5, 1.51, 1.52, 1.53, 1.54, 1.55, 1.56, 1.57, 1.58, 1.59, 1.6, or within any range having any two of these values as endpoints.

Reflection can occur at the interface of materials where there is a discrete change in refractive index (Δn) between the materials. And the larger the change in refractive index (Δn) the larger the amount of reflection that can occur at an interface. As such, fiber and matrix materials that are refractive index-matched (i.e., having a Δn of 0.05 or less) reduces light reflection at the interface between the fibers and the matrix material. And, by reducing light reflection, refractive index matching facilitates optical transparency of optically transparent fiberglass composite layer 110, and therefore the optical transparency of cover substrate 100. The refractive index of matrix material 140 is the refractive index of the material in its fully solidified state (e.g., fully cured state).

In some embodiments, optically transparent fiberglass composite layer 110 and optically transparent hard-coat layer 120 may be refractive index-matched layers. In such embodiments, optically transparent fiberglass composite layer 110 has a first refractive index and optically transparent hard-coat layer 120 has a second refractive index, and a difference between the first refractive index and the second refractive index (Δn) is 0.05 or less. Similar to refractive index matching between fiberglass layer 150 and matrix material 140, refractive index matching between layers 110 and 120 reduces light reflection at the interface between the layers, and facilitates optical transparency of cover substrate 100.

Figure 4:
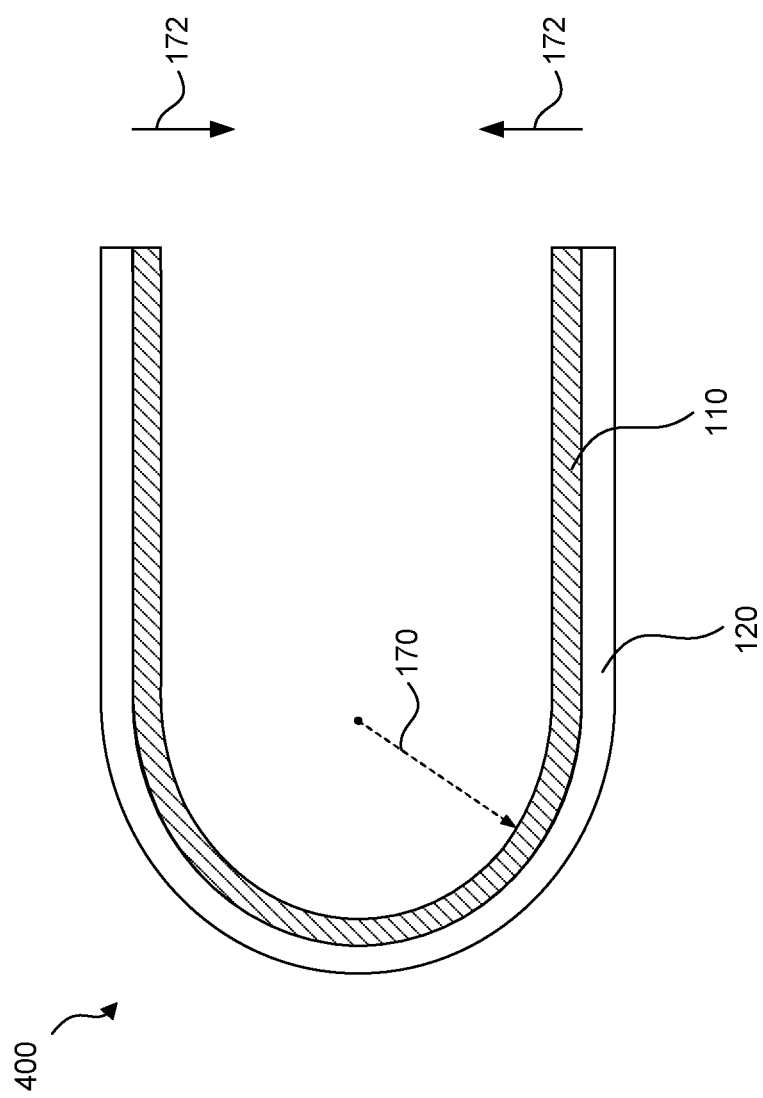
FIG. 4 illustrates a cross-sectional view of the cover substrate of FIG. 1 upon bending of the substrate.

In some embodiments, cover substrate 100 may have a bend radius 170 (see FIG. 4) of 5 mm or less. In some embodiments, cover substrate 100 may have a bend radius 170 of 4 mm or less. In some embodiments, cover substrate 100 may have a bend radius 170 of 3 mm or less. Cover substrate 100 achieves a bend radius of "X" if it resists failure when cover substrate 100 is held at "X" radius for at least 60 minutes at about 25° C. and about 50% relative humidity. The term "failure" for purposes of bend radius tests means that the cover substrate delaminates, cracks, creases, separates, or is otherwise made unsuitable for its intended use. FIG. 4 illustrates the bending force 172 applied to cover substrate 100 to bend it to a bend radius 170. In some embodiments, optically transparent fiberglass composite layer 110 and/or optically transparent hard-coat layer 120 may have a bend radius of 5 mm or less, 4 mm or less, 3 mm or less, 2 mm or less, or 1 mm or less. The bend radius of optically transparent fiberglass composite layer 110 may the same or different when bent in first lateral direction 190 and second lateral direction 192.

Figure 5:
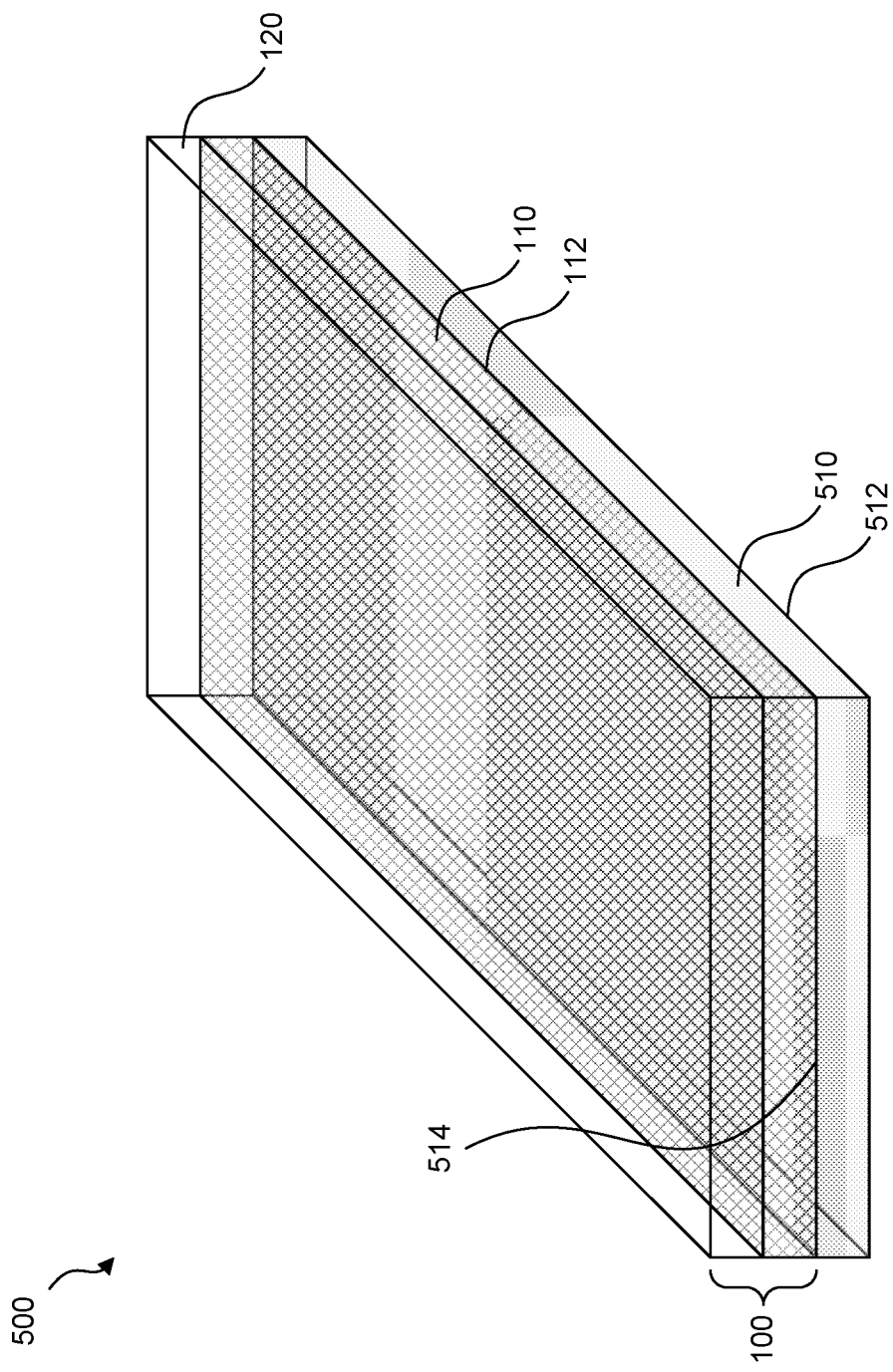
FIG. 5 illustrates an electronic display component according to some embodiments.

FIG. 5 illustrates an electronic display component 500 including cover substrate 100 according to some embodiments. Electronic display component 500 includes an electronic display 510 including a bottom surface 512 and a display surface (top surface, user-facing surface) 514. Electronic display 510 may be, for example, a light emitting diode (LED) display or an organic light emitting diode (OLED) display. In some embodiments, electronic display 510 may be a flexible electronic display. As used herein, a flexible layer, article, or display is a layer, article, or display having a bend radius, by itself, of 10 mm or less.

Cover substrate 100, and particularly bottom surface 112 of optically transparent fiberglass composite layer 110, is disposed over display surface 514. In some embodiments, an optically transparent adhesive layer may be disposed on display surface 514 for bonding optically transparent fiberglass composite layer 110 to display surface 514. In some embodiments, the optically transparent adhesive layer may have a thickness in a range of 5 microns to 50 microns as described herein for optically transparent adhesive layer 130. In some embodiments, optically transparent fiberglass composite layer 110 may be disposed on display surface 514. In operation, cover substrate 100 is configured to protect electronic display 510 from impact and/or puncture forces. Electronic display component 500 may be devoid of a glass layer disposed between display surface 514 and optically transparent fiberglass composite layer 110. Relatedly, in some embodiments, cover substrate 100 may be devoid of a glass layer present between a topmost and bottommost surface of cover substrate 100. In such embodiments, the mechanical attributes provided by cover substrate 100 eliminate the need for a glass layer that provides protection for electronic display 510.

In some embodiments, cover substrate 100 may have an impact resistance defined by the capability of cover substrate 100 to avoid failure at a pen drop height that is "Y" centimeters (cm) or more in a Pen Drop Test. In some embodiments, "Y" may be 7. In some embodiments, "Y" may be 8. In some embodiments, "Y" may be 9. In some embodiments, "Y" may be 10. In some embodiments, "Y" may be 11. In some embodiments, "Y" may be 12. The pen drop height and the control pen drop height are measured according to the following "Pen Drop Test."

As described and referred to herein, "Pen Drop Test" is conducted such that samples of cover substrates disposed over a flexible OLED display are tested with the load (i.e., from a pen dropping at a certain height) imparted to the top surface of the of the cover substrate with the opposite side of the flexible OLED display being supported by an aluminum plate (6063 aluminum alloy, as polished to a surface roughness with 400 grit paper). No tape is used on the side of the sample resting on the aluminum plate. A Samsung® S6 Edge OLED display was used as the flexible OLED display for the Pen Drop Test. And 50 micron thick tape was used to bond cover substrate samples to the Samsung® S6 Edge OLED display.

A tube is used for the Pen Drop Test to guide a pen to the sample, and the tube is placed in contact with the top surface of the sample so that the longitudinal axis of the tube is substantially perpendicular to the top surface of the sample. The tube has an outside diameter of 2.54 cm (1 inch), an inside diameter of 1.4 cm (nine sixteenths of an inch) and a length of 90 cm. An acrylonitrile butadiene ("ABS") shim is employed to hold the pen at a desired height for each test. After each drop, the tube is relocated relative to the sample to guide the pen to a different impact location on the sample. The pen employed in the Pen Drop Test is a BIC® Easy Glide Pen, Fine, having a tungsten carbide ball point tip of 0.7 mm diameter, and a weight of 5.73 grams including the cap (4.68 g without the cap).

For the Pen Drop Test, the pen is dropped with the cap attached to the top end (i.e., the end opposite the tip) so that the ball point can interact with the test sample. In a drop sequence according to Pen Drop Test, one pen drop is conducted at an initial height of 1 cm, followed by successive drops in 1 cm increments up to 20 cm, and then after 20 cm, 2 cm increments until failure of the test sample. After each drop is conducted, the presence of any observable fracture, failure or other evidence of damage to the cover substrate, and/or the flexible OLED display, is recorded along with the particular pen drop height. Using the Pen Drop Test, multiple samples can be tested according to the same drop sequence to generate a population with improved statistics. For the Pen Drop Test, the pen is to be changed to a new pen after every 5 drops, and for each new sample tested. In addition, all pen drops are conducted at random locations on the sample at or near the center of the sample, with no pen drops near or on the edge of the samples.

nesses were tested: (a) 130 microns (um), 75 microns, 120 microns, and 125 microns.

Test samples 602 included a 50 micron thick polyimide (PI) layer 640 bonded to flexible OLED display 610 via a 50 micron thick double-sided tape layer 620. And test samples 604 included a 75 micron thick ion-exchanged glass layer (75 um IOX glass) 650 bonded to flexible OLED display 610 via a 50 micron thick double-sided tape layer 620.

TABLE 1

Pen Drop Test Results

| | HDF 25 μm OCA FG (80-2/1080 130 μm) 50 μm Tape S6 Edge OLED | HDF 25 μm OCA FG (80-2/1080 75 μm) 50 μm Tape S6 Edge OLED | HDF 25 μm OCA FG (80-2/1080 120 μm) 50 μm Tape S6 Edge OLED | HDF 25 μm OCA FG (80-2/1080 125 μm) 50 μm Tape S6 Edge OLED | PI 50 μm Tape S6 Edge OLED | 75 μm IOX glass 50 μm Tape S6 Edge OLED |
|---|---|---|---|---|---|---|
| | | | Pen Drop Failure Height, cm | | | |
| HDF/PI Dimple | | | | | 3 | |
| OLED Dimple | 2 | | | | 5 | |
| HDF/Glass Failure | 7, 11 | 10, 10 | 11, 8 | 10, 7 | | 4.6 |
| OLED Bright Spot | 6, 12 | 11, 15 | 11, 12 | 13, 10, 11 | 6.2 | 9.2 |

For purposes of the Pen Drop Test, "failure" of a cover substrate means the formation of a visible mechanical defect in a cover substrate. The mechanical defect may be a crack or plastic deformation (e.g., surface indentation). The crack may be a surface crack or a through crack (i.e., a crack extending from one major surface through to the opposite major surface). The crack may be formed on an interior or exterior surface of a cover substrate. The crack may extend through all or a portion of the layers of a cover substrate. A visible mechanical defect has minimum dimension of 0.2 millimeters or more.

Figure 6C:
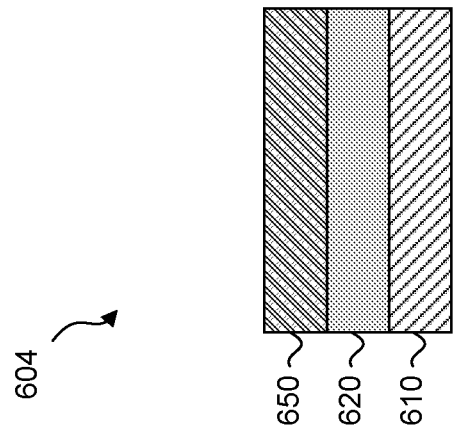
FIG. 6C illustrates a third test sample configuration.
Figure 6B:
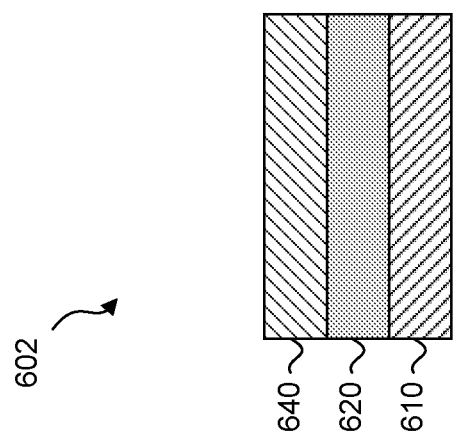
FIG. 6B illustrates a second test sample configuration.
Figure 6A:
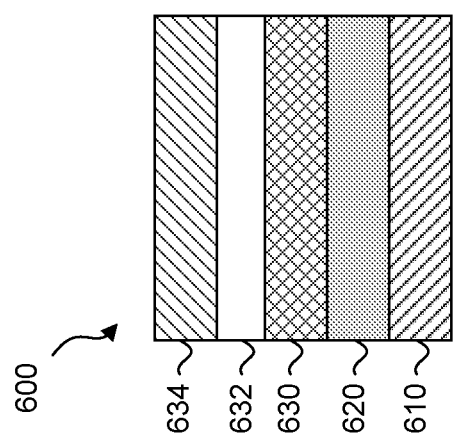
FIG. 6A illustrates a first test sample configuration.

Table 1 below shows Pen Drop Test results for four fiberglass composite cover substrates according to embodiments discussed herein, one cover substrate with a glass layer and a polyimide (PI) layer, and one cover substrate including only a glass layer. The four fiberglass composite cover substrates had the configuration of test sample 600 shown in FIG. 6A. The glass layer and PI layer cover substrate had the configuration of test sample 602 shown in FIG. 6B. And the glass-layer-only cover substrate had the configuration of test sample 604 shown in FIG. 6C. The fiberglass composite cover substrate data includes results from two samples for each of the four fiberglass composite cover substrates. The data reported for the PI and glass layer cover substrate and the glass-layer-only cover substrate are the average of 5 samples tested.

Each fiberglass composite cover substrate test sample 600 included an optically transparent fiberglass composite layer 630 disposed over a flexible OLED display 610 via a 50 micron thick double-sided tape layer 620, and an optically transparent hard coat layer 634 (referred to as "HDF" in Table 1) bonded to optically transparent fiberglass composite layer 630 via a 25 micron thick optically transparent adhesive layer 632. The preparation of optically transparent fiberglass composite layer 630 is described below. Each test sample 600 included the same kind of optically transparent fiberglass composite layer 630. Only the thickness of optically transparent fiberglass composite layer 630 was changed between samples 600. The following four thick- As shown in Table 1, when OLED display 610 was covered by PI layer 640, visible damage in form of a dimple in PI layer 640 occurred at 3 cm and pixel failure (in the form of a dimple in the OLED) in OLED display 610 occurred at 5 cm. And, for the 75 micron thick ion-exchange strengthened glass, failure occurred around 5 cm and pixel damage (in the form of a bright spot in the OLED) occurred at 9 cm. Accordingly, the ion-exchanged glass provides almost twice as much puncture resistance as a PI layer. However, neither the ion-exchanged glass nor the PI layer provides as much puncture resistance as cover substrates according to embodiments discussed herein. When OLED display 610 is covered by cover substrates according to embodiments discussed herein (i.e., samples 600), visible damage to the cover substrates occurred at heights of 7 cm or more and pixel damage in OLED display 610 occurred at heights of 10 cm or more (and at an average of about 12 cm across all four substrates)

Figure 7A:
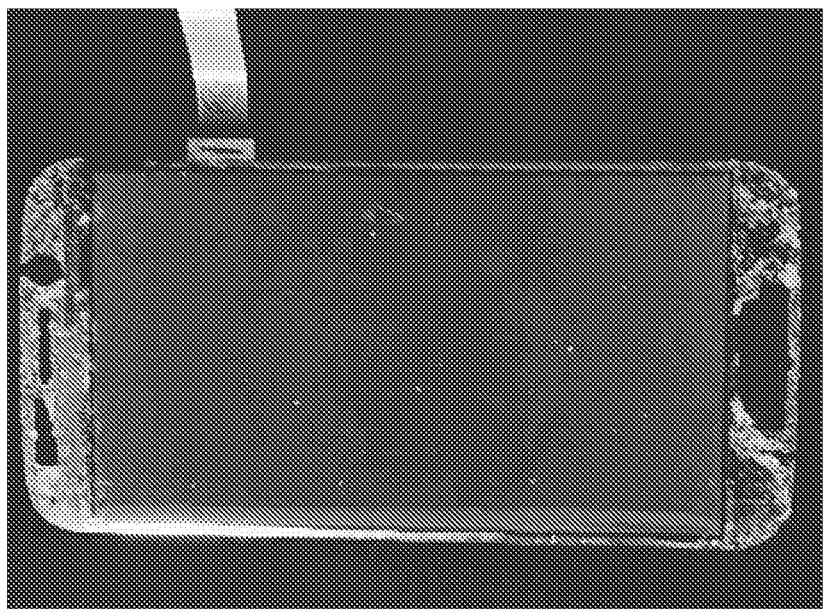
FIG. 7A is a photograph of a damaged electronic display.
Figure 7C:
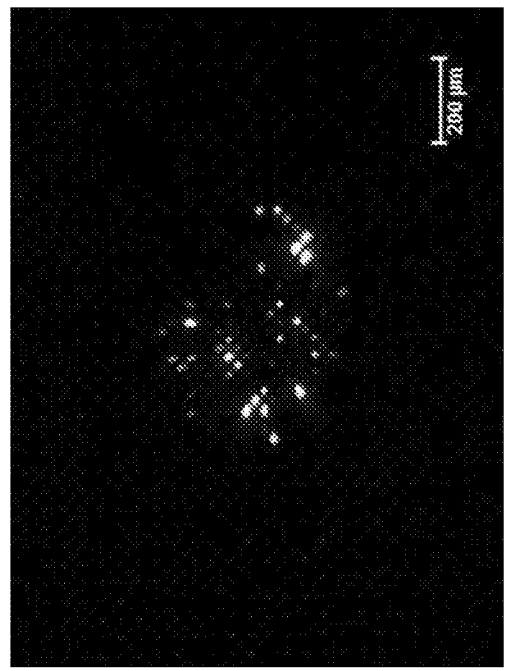
FIG. 7C is a second microscopic image of a damaged electronic display.
Figure 7B:
FIG. 7B is a first microscopic image of a damaged electronic display.

FIGS. 7A-7C show pixel damage on OLED display 610 after testing. As shown in FIG. 7A, damage to OLED display 610 results in bright spots on OLED display 610 where a pen was dropped in the Pen Drop Test. FIG. 7B shows a damaged pixel under a microscope for a 6 cm pen drop failure on an unprotected OLED display 610. FIG. 7C shows a damaged pixel under a microscope for a 15 cm pen drop failure on an OLED display 610 protected with an optically transparent hard coat layer 634 bonded to an optically transparent fiberglass composite layer 630 via a 25 micron thick optically transparent adhesive layer 632.

Optically transparent fiberglass composite layer 630 for the Pen Drop Test results reported in Table 1 was prepared as follows. A resin composition comprising 66.5 wt % of M2100 (ethoxylated (10) bisphenol A diacrylate, refractive index 1.516, Miwon Specialty Chemical Co., Ltd), 22 wt % of PE210HA (bisphenol A epoxy acrylate, refractive index 1.562, Miwon Specialty Chemical Co., Ltd), 10 wt % of M1142 (o-Phenylphenol ethyl acrylate, refractive index 1.577, Miwon Specialty Chemical Co., Ltd), and 1.5 wt % of Omnirad TPO-L photo-initiator (diphenyl (2,4,6-trimethylbenzoyl) phosphine oxide, BASF Canada Inc.) was prepared by mixing in a glass jacketed beaker at 60-65° C. until homogeneous. A portion of this resin composition was placed on a release film, a woven glass fabric (1080 E-glass, 40 micron thick, refractive index 1.560, available from Jushi Group Co., Ltd.) was placed on top of the resin-coated release film, and a second portion of the resin was placed on top of the woven glass fabric. Wetting continued at about 60° C. (degrees Celsius) for 30 minutes. The transparent composite film was covered by another layer of the release film. A slight excess amount of resin was used to fully wet the glass fabric. A shim material was used to control the thickness and a handheld roller was used to remove the air bubbles and excess resin liquid. The film was then cured using a Fusion UV 300W "D" bulb lamp at 50% power (UV intensity 2000 mW/cm$^2$) with a nitrogen purge. The film received a dose of approximately 1250 mJ/cm$^2$. The cured film was allowed to condition overnight in a controlled environment at 23° C. and 50% relative humidity before testing.

In some embodiments, cover substrate 100 may be a 2D, 2.5D, or 3D cover substrate. As used herein, "2D cover substrate" includes a cover substrate having a perimeter edge with a chamfered shape on the top and/or bottom surfaces of the cover substrate adjacent to the perimeter edge. The chamfered shape on the top and/or bottom surfaces may be formed by, for example, a finishing method including mechanical grinding. A 2D cover substrate may have a chamfered shape on the top and bottom surfaces of the cover substrate that is the same or different.

As used herein, "2.5D cover substrate" means a cover substrate having a perimeter edge with a curved surface on its top (user-facing) side. The curved surface may be formed by, for example, a mechanical polishing method. The curved surface on the top side of a 2.5D cover substrate is smoother to the touch than a chamfered surface of a 2D cover substrate. As used herein, "3D cover substrate" means a cover substrate having a bent perimeter edge that forms a non-planar shape. The bent perimeter edge may be formed by, for example, thermal forming and/or cold-forming. A 3D cover substrate has a curved bottom surface and a curved top surface adjacent to the perimeter edge of the cover substrate. A 3D cover substrate refers to a cover substrate that holds a 3D shape as described herein at room temperature (23° C.) and when not being subject to an external force (e.g., a bending force). A flexible film that may deform under its own weight at room temperature is not considered a 3D cover substrate as described herein. Both 2.5D and 3D cover substrates have a topmost exterior surface that includes a substantially flat central area and a curved peripheral area disposed around all or portion of the substantially flat central area. A 3D cover substrate includes a bottommost exterior surface that includes a substantially flat central area and a curved peripheral area disposed around all or portion of the substantially flat central area.

FIG. 8A shows a 2D cover substrate 800 according to some embodiments. Cover substrate 800 includes a substantially flat central area 802 a chamfered peripheral area 804. Peripheral area 804 of 2D cover substrate 800 may be finished by a mechanical grinding method to create a chamfered shape on the top surface 806 and/or bottom surface 808 of cover substrate 800. In some embodiments, the chamfered shape on top surface 806 and bottom surface 808 of cover substrate 800 may be the same.

FIG. 8B shows a 2.5D cover substrate 810 according to some embodiments. 2.5D cover substrate 810 includes a substantially flat central area 812 and a curved peripheral area 814 on a top surface 816 of cover substrate 810. Curved peripheral area 804 may be finished with a mechanical polishing method to form a curved surface on top surface 816. As such, 2.5D cover substrate 810 may have a peripheral area 814 having a flat bottom surface 818 and a curved top surface 816. In some embodiments, a 2.5D cover substrate may be made by mechanically polishing a peripheral area of an optically transparent fiberglass composite layer and bonding an optically transparent hard-coat layer to the curved top surface.

FIG. 8C shows a 3D cover substrate 820 according to some embodiments. 3D cover substrate 820 includes a substantially flat central area 822 a curved peripheral area 824. 3D cover substrate 820 has a curved top surface 826 and a curved bottom surface 828 in curved peripheral area 824. 3D cover substrate 820 may be formed by, for example, molding an optically transparent fiberglass composite layer having a 3D shape and bonding an optically transparent hard-coat layer to the optically transparent fiberglass composite layer.

Figure 9:
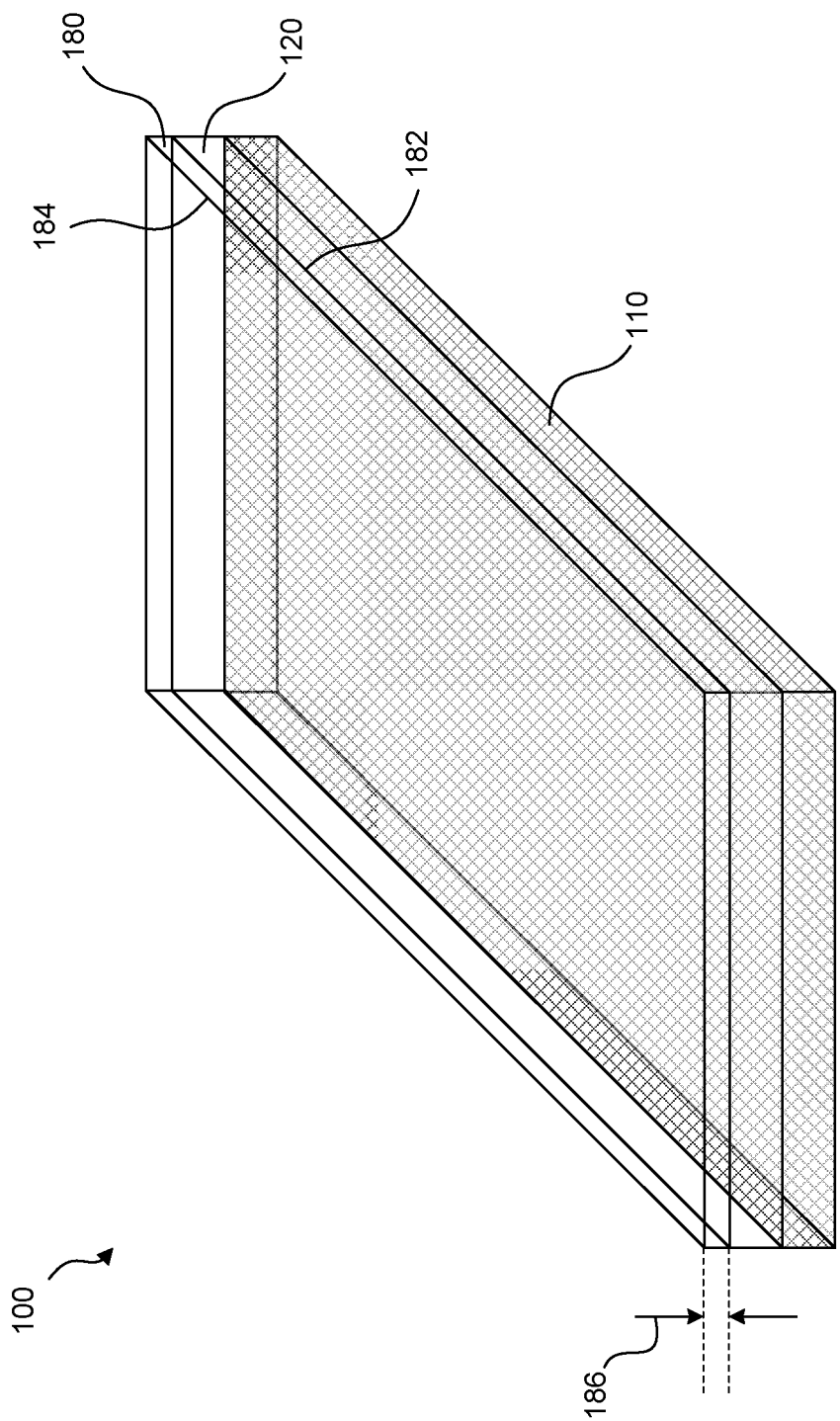
FIG. 9 illustrates a cover substrate including a coating layer according to some embodiments.

In some embodiments, for example as shown in FIG. 9, cover substrate 100 may be coated with a coating layer 180 having a bottom surface 182, a top surface 184, and a thickness 186. In some embodiments, coating layer 180 may bonded to top surface 124 of optically transparent hard-coat layer 120. In some embodiments, coating layer 180 may be disposed on top surface 124 of optically transparent hard-coat layer 120. In some embodiments, multiple coating layers 180, of the same or different types, may be coated over a cover substrate 100.

In some embodiments, coating layer(s) 180 may be a scratch resistant coating layer. Exemplary materials used in a scratch resistant coating layer may include an inorganic carbide, nitride, oxide, oxy-nitride, diamond-like material, or a combination thereof. In some embodiments, the scratch resistant coating layer may include a multilayer structure of aluminum oxy-nitride (AlON) and silicon dioxide (SiO2). In some embodiments, the scratch resistant coating layer may include a metal oxide layer, a metal nitride layer, a metal carbide layer, a metal oxy-nitride layer, a metal boride layer or a diamond-like carbon layer. Example metals for such an oxide, nitride, oxy-nitride, carbide or boride layer include boron, aluminum, silicon, titanium, vanadium, chromium, yttrium, zirconium, niobium, molybdenum, tin, hafnium, tantalum, and tungsten. In some embodiments, the coating layer may include an inorganic material. Non-limiting example inorganic layers include aluminum oxide and zirconium oxide layers.

In some embodiments, the scratch resistant coating layer may include a scratch resistant coating layer as described in U.S. Pat. No. 9,328,016, issued on May 3, 2016, which is hereby incorporated by reference in its entirety by reference thereto. In some embodiments, the scratch resistant coating layer may include a silicon-containing oxide, a silicon-containing nitride, an aluminum-containing nitride (e.g., AlN and AlxSiyN), an aluminum-containing oxy-nitride (e.g., AlOxNy and SiuAlvOxNy), an aluminum-containing oxide, a silicon-containing oxy-nitride, or combinations thereof. In some embodiments, the scratch resistant coating layer may include transparent dielectric materials such as SiO2, GeO2, Al2O3, Nb2O5, TiO2, Y2O3 and other similar materials and combinations thereof. In some embodiments, the scratch resistant coating layer may include a scratch resistant coating layer as described in U.S. Pat. No. 9,110, 230, issued on Aug. 18, 2015, which is hereby incorporated by reference in its entirety by reference thereto. In some embodiments, the scratch resistant coating layer may include one or more of AN, Si3N4, AlOxNy, SiOxNy, Al2O3, SixCy, SixOyCz, ZrO2, TiOxNy, diamond, diamond-like carbon, and SiuAlvOxNy. In some embodiments, the scratch resistant coating layer may include a scratch resistant coating layer as described in U.S. Pat. No. 9,359,261, issued on Jun. 7, 2016, or U.S. Pat. No. 9,335,444, issued on May 10, 2016, both of which are hereby incorporated by reference in their entirety by reference thereto.

In some embodiments, coating layer(s) 180 may be an anti-reflection coating layer. Exemplary materials suitable for use in the anti-reflection coating layer include: SiO2, $Al_2O_3$, $GeO_2$, SiO, $AlO_xN_y$, AlN, $SiN_x$, $SiO_xN_y$, $Si_uAl_vO_xN_y$, $Ta_2O_5$, $Nb_2O_5$, $TiO_2$, $ZrO_2$, TiN, MgO, $MgF_2$, $BaF_2$, $CaF_2$, $SnO_2$, $HfO_2$, $Y_2O_3$, $MoO_3$, $DyF_3$, $YbF_3$, $YF_3$, $CeF_3$, polymers, fluoropolymers, plasma-polymerized polymers, siloxane polymers, silsesquioxanes, polyimides, fluorinated polyimides, polyetherimide, polyethersulfone, polyphenylsulfone, polycarbonate, polyethylene terephthalate, polyethylene naphthalate, acrylic polymers, urethane polymers, polymethylmethacrylate, and other materials cited above as suitable for use in a scratch resistant layer. An anti-reflection coating layer may include sub-layers of different materials.

In some embodiments, the anti-reflection coating layer may include a hexagonally packed nanoparticle layer, for example but not limited to, the hexagonally packed nanoparticle layers described in U.S. Pat. No. 9,272,947, issued Mar. 1, 2016, which is hereby incorporated by reference in its entirety by reference thereto. In some embodiments, the anti-reflection coating layer may include a nanoporous Si-containing coating layer, for example but not limited to the nanoporous Si-containing coating layers described in WO2013/106629, published on Jul. 18, 2013, which is hereby incorporated by reference in its entirety by reference thereto. In some embodiments, the anti-reflection coating may include a multilayer coating, for example, but not limited to the multilayer coatings described in WO2013/106638, published on Jul. 18, 2013; WO2013/082488, published on Jun. 6, 2013; and U.S. Pat. No. 9,335,444, issued on May 10, 2016, all of which are hereby incorporated by reference in their entirety by reference thereto.

In some embodiments, coating layer(s) may be an easy-to-clean coating layer. In some embodiments, the easy-to-clean coating layer may include a material selected from the group consisting of fluoroalkylsilanes, perfluoropolyether alkoxy silanes, perfluoroalkyl alkoxy silanes, fluoroalkylsilane-(non-fluoroalkylsilane) copolymers, and mixtures of fluoroalkylsilanes. In some embodiments, the easy-to-clean coating layer may include one or more materials that are silanes of selected types containing perfluorinated groups, for example, perfluoroalkyl silanes of formula $(R_F)_y Si_{X4-y}$, where RF is a linear $C6$-$C_{30}$ perfluoroalkyl group, X=Cl, acetoxy, —$OCH_3$, and —$OCH_2CH_3$, and y=2 or 3. The perfluoroalkyl silanes can be obtained commercially from many vendors including Dow-Corning (for example fluorocarbons 2604 and 2634), 3MCompany (for example ECC-1000 and ECC-4000), and other fluorocarbon suppliers such as Daikin Corporation, Ceko (South Korea), Cotec-GmbH (DURALON UltraTec materials) and Evonik. In some embodiments, the easy-to-clean coating layer may include an easy-to-clean coating layer as described in WO2013/082477, published on Jun. 6, 2013, which is hereby incorporated by reference in its entirety by reference thereto.

In some embodiments, coating layer(s) 180 may be an anti-glare layer formed on top surface 124 of optically transparent hard-coat layer 120. Suitable anti-glare layers include, but are not limited to, the anti-glare layers prepared by the processes described in U.S. Pat. Pub. Nos. 2010/0246016, 2011/0062849, 2011/0267697, 2011/0267698, 2015/0198752, and 2012/0281292, all of which are hereby incorporated by reference in their entirety by reference thereto.

In some embodiments, coating layer(s) 180 may be an anti-fingerprint coating layer. Suitable anti-fingerprint coating layers include, but are not limited to, oleophobic surface layers including gas-trapping features, as described in, for example, U.S. Pat. App. Pub. No. 2011/0206903, published Aug. 25, 2011, and oleophilic coatings formed from an uncured or partially-cured siloxane coating precursor comprising an inorganic side chain that is reactive with the surface of the glass or glass-ceramic substrate (e.g., partially-cured linear alkyl siloxane), as described in, for example, U.S. Pat. App. Pub. No. 2013/0130004, published May 23, 2013. The contents of U.S. Pat. App. Pub. No. 2011/0206903 and U.S. Pat. App. Pub. No. 2013/0130004 are incorporated herein by reference in their entirety.

In some embodiments, coating layer(s) 180 may be an anti-microbial and/or anti-viral layer may be formed on top surface 124 of optically transparent hard-coat layer 120. Suitable anti-microbial and/or anti-viral layers include, but are not limited to, an antimicrobial Ag+ region extending from the surface of the glass article to a depth in the glass article having a suitable concentration of Ag+1 ions on the surface of the glass article, as described in, for example, U.S. Pat. App. Pub. No. 2012/0034435, published Feb. 9, 2012, and U.S. Pat. App. Pub. No. 2015/0118276, published Apr. 30, 2015. The contents of U.S. Pat. App. Pub. No. 2012/0034435 and U.S. Pat. App. Pub. No. 2015/0118276 are incorporated herein by reference in their entirety.

Figure 10:
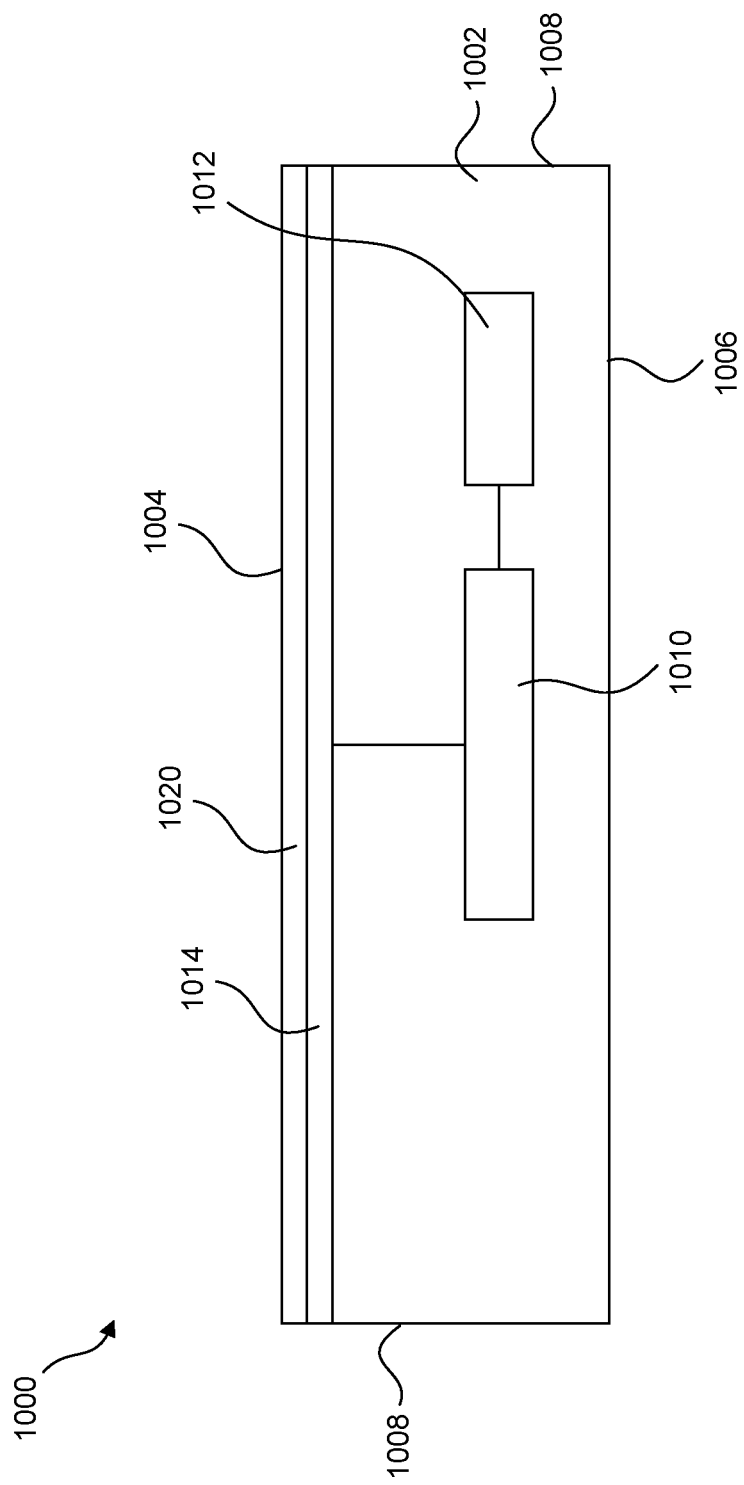
FIG. 10 illustrates a consumer product according to some embodiments.

FIG. 10 shows a consumer electronic product 1000 according to some embodiments. Consumer electronic product 1000 may include a housing 1002 having a front (user-facing) surface 1004, a back surface 1006, and side surfaces 1008. Electrical components may be provided at least partially within housing 1002. The electrical components may include, among others, a controller 1010, a memory 1012, and display components, including a display 1014. In some embodiments, display 1014 may be provided at or adjacent to front surface 1004 of housing 1002.

As shown for example in FIG. 10, consumer electronic product 1000 may include a cover substrate 1020. Cover substrate 1020 may serve to protect display 1014 and other components of electronic product 1000 (e.g., controller 1010 and memory 1012) from damage. In some embodiments, cover substrate 1020 may be disposed over display 1014. In some embodiments, cover substrate 1020 may be bonded to display 1014. In some embodiments, cover substrate 1020 may be a cover substrate defined in whole or in part by a cover substrate discussed herein. Cover substrate 1020 may be a 2D, 2.5D, or 3D cover substrate. In some embodiments, cover substrate 1020 may define front surface 1004 of housing 1002. In some embodiments, cover substrate 1020 may define front surface 1004 of housing 1002 and all or a portion of side surfaces 1008 of housing 1002. In some embodiments, consumer electronic product 1000 may include a cover substrate defining all or a portion of back surface 1006 of housing 1002.

As used herein the term "glass" is meant to include any material made at least partially of glass, including glass and glass-ceramics. "Glass-ceramics" include materials produced through controlled crystallization of glass. In embodiments, glass-ceramics have about 30% to about 90% crystallinity. Non-limiting examples of glass ceramic systems that may be used include $Li_2O \times Al_2O_3 \times nSiO_2$ (i.e. LAS system), $MgO \times Al_2O_3 \times nSiO_2$ (i.e. MAS system), and $ZnO \times Al_2O_3 \times nSiO_2$ (i.e. ZAS system).

In one or more embodiments, the amorphous substrate may include glass, which may be strengthened or non-strengthened. Examples of suitable glass include soda lime glass, alkali aluminosilicate glass, alkali containing borosilicate glass and alkali aluminoborosilicate glass. In some variants, the glass may be free of lithia. In one or more alternative embodiments, the substrate may include crystalline substrates such as glass ceramic substrates (which may be strengthened or non-strengthened) or may include a single crystal structure, such as sapphire. In one or more specific embodiments, the substrate includes an amorphous base (e.g., glass) and a crystalline cladding (e.g., sapphire layer, a polycrystalline alumina layer and/or or a spinel ($MgAl_2O_4$) layer).

A substrate or layer may be strengthened to form a strengthened substrate or layer. As used herein, the term "strengthened substrate" may refer to a substrate and/or layer that has been chemically strengthened, for example through ion-exchange of larger ions for smaller ions in the surface of the substrate and/or layer. However, other strengthening methods known in the art, such as thermal tempering, or utilizing a mismatch of the coefficient of thermal expansion between portions of the substrate and/or layer to create compressive stress and central tension regions, may be utilized to form strengthened substrates and/or layers.

Where the substrate and/or layer is chemically strengthened by an ion exchange process, the ions in the surface layer of the substrate and/or layer are replaced by—or exchanged with—larger ions having the same valence or oxidation state. Ion exchange processes are typically carried out by immersing a substrate and/or layer in a molten salt bath containing the larger ions to be exchanged with the smaller ions in the substrate and/or layer. It will be appreciated by those skilled in the art that parameters for the ion exchange process, including, but not limited to, bath composition and temperature, immersion time, the number of immersions of the substrate and/or layer in a salt bath (or baths), use of multiple salt baths, additional steps such as annealing, washing, and the like, are generally determined by the composition of the substrate and/or layer and the desired compressive stress (CS), depth of compressive stress layer (or depth of layer) of the substrate and/or layer that result from the strengthening operation. By way of example, ion exchange of alkali metal-containing glass substrates and/or layers may be achieved by immersion in at least one molten bath containing a salt such as, but not limited to, nitrates, sulfates, and chlorides of the larger alkali metal ion. The temperature of the molten salt bath typically is in a range from about 380° C. up to about 450° C., while immersion times range from about 15 minutes up to about 40 hours. However, temperatures and immersion times different from those described above may also be used.

In addition, non-limiting examples of ion exchange processes in which glass substrates are immersed in multiple ion exchange baths, with washing and/or annealing steps between immersions, are described in U.S. patent application Ser. No. 12/500,650, filed Jul. 10, 2009, by Douglas C. Allan et al., entitled "Glass with Compressive Surface for Consumer Applications" and claiming priority from U.S. Provisional Patent Application No. 61/079,995, filed Jul. 11, 2008, in which glass substrates are strengthened by immersion in multiple, successive, ion exchange treatments in salt baths of different concentrations; and U.S. Pat. No. 8,312,739, by Christopher M. Lee et al., issued on Nov. 20, 2012, and entitled "Dual Stage Ion Exchange for Chemical Strengthening of Glass," and claiming priority from U.S. Provisional Patent Application No. 61/084,398, filed Jul. 29, 2008, in which glass substrates are strengthened by ion exchange in a first bath is diluted with an effluent ion, followed by immersion in a second bath having a smaller concentration of the effluent ion than the first bath. The contents of U.S. patent application Ser. No. 12/500,650 and U.S. Pat. No. 8,312,739 are incorporated herein by reference in their entirety.

While various embodiments have been described herein, they have been presented by way of example, and not limitation. It should be apparent that adaptations and modifications are intended to be within the meaning and range of equivalents of the disclosed embodiments, based on the teaching and guidance presented herein. It therefore will be apparent to one skilled in the art that various changes in form and detail can be made to the embodiments disclosed herein without departing from the spirit and scope of the present disclosure. The elements of the embodiments presented herein are not necessarily mutually exclusive, but may be interchanged to meet various situations as would be appreciated by one of skill in the art.

Embodiments of the present disclosure are described in detail herein with reference to embodiments thereof as illustrated in the accompanying drawings, in which like reference numerals are used to indicate identical or functionally similar elements. References to "one embodiment," "an embodiment," "some embodiments," "in certain embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The examples are illustrative, but not limiting, of the present disclosure. Other suitable modifications and adaptations of the variety of conditions and parameters normally encountered in the field, and which would be apparent to those skilled in the art, are within the spirit and scope of the disclosure.

The term "or," as used herein, is inclusive; more specifically, the phrase "A or B" means "A, B, or both A and B." Exclusive "or" is designated herein by terms such as "either A or B" and "one of A or B," for example.

The indefinite articles "a" and "an" to describe an element or component means that one or at least one of these elements or components is present. Although these articles are conventionally employed to signify that the modified noun is a singular noun, as used herein the articles "a" and "an" also include the plural, unless otherwise stated in specific instances. Similarly, the definite article "the," as used herein, also signifies that the modified noun may be singular or plural, again unless otherwise stated in specific instances.

As used in the claims, "comprising" is an open-ended transitional phrase. A list of elements following the transitional phrase "comprising" is a non-exclusive list, such that elements in addition to those specifically recited in the list may also be present. As used in the claims, "consisting essentially of" or "composed essentially of" limits the composition of a material to the specified materials and those that do not materially affect the basic and novel characteristic(s) of the material. As used in the claims, "consisting of" or "composed entirely of" limits the composition of a material to the specified materials and excludes any material not specified.

The term "wherein" is used as an open-ended transitional phrase, to introduce a recitation of a series of characteristics of the structure.

Where a range of numerical values is recited herein, comprising upper and lower values, unless otherwise stated in specific circumstances, a range is intended to include the endpoints thereof, and all integers and fractions within a range. It is not intended that the scope of the claims be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. Finally, when the term "about" is used in describing a value or an end-point of a range, the disclosure should be understood to include the specific value or end-point referred to. Whether or not a numerical value or end-point of a range recites "about," the numerical value or end-point of a range is intended to include two embodiments: one modified by "about," and one not modified by "about."

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

The present embodiment(s) have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

It is to be understood that the phraseology or terminology used herein is for the purpose of description and not of limitation. The breadth and scope of the present disclosure should not be limited by any of the above-described exemplary embodiments, but should be defined in accordance with the following claims and their equivalents.

What is claimed is:

1. A cover substrate for an electronic display, the cover substrate comprising:
   an optically transparent fiberglass composite layer comprising a fiberglass layer embedded in a matrix material and a bottom surface defining a bottommost exterior surface of the cover substrate, wherein the fiberglass layer comprises fibers, the fibers comprising a glass material comprising a first refractive index and the matrix material comprises a second refractive index, and wherein a difference between the first refractive index and the second refractive index is 0.05 or less; and
   an optically transparent polymeric hard-coat layer bonded to a top surface of the optically transparent fiberglass composite layer, the polymeric hard-coat layer having a pencil hardness higher than that of the fiberglass composite layer.

2. A cover substrate for an electronic display, the cover substrate comprising:
   an optically transparent fiberglass composite layer comprising a fiberglass layer embedded in a matrix material and a bottom surface defining a bottommost exterior surface of the cover substrate;
   an optically transparent hard-coat layer bonded to a top surface of the optically transparent fiberglass composite layer; and
   an optically transparent adhesive layer disposed on the optically transparent fiberglass composite layer and bonding the optically transparent hard-coat layer to the optically transparent fiberglass composite layer.

3. The cover substrate of claim 2, wherein the optically transparent adhesive layer comprises a thickness in a range of from 5 microns to 50 microns.

4. The cover substrate of claim 1, wherein the optically transparent fiberglass composite layer comprises a thickness in a range of 25 microns to 200 microns.

5. The cover substrate of claim 1, wherein the fiberglass layer comprises a thickness in a range of 10 microns to 100 microns.

6. The cover substrate of claim 1, wherein the cover substrate comprises a bend radius of 3 mm or less.

7. The cover substrate of claim 1, wherein a topmost exterior surface of the cover substrate comprises a flat central area and a curved peripheral area disposed around at least a portion of the substantially flat central area.

8. The cover substrate of claim 1, wherein the optically transparent fiberglass composite layer comprises an elastic modulus in a range of from 200 MPa to 2500 MPa.

9. The cover substrate of claim 1, wherein the optically transparent fiberglass composite layer comprises a first refractive index and the optically transparent hard-coat layer comprises a second refractive index, and wherein a difference between the first refractive index and the second refractive index is 0.05 or less.

10. The cover substrate of claim 1, wherein the cover substrate comprises an impact resistance defined by the capability of the cover substrate to avoid failure at a minimum pen drop height of 7 centimeters in a Pen Drop Test.

11. The cover substrate of claim 1, wherein the polymeric hard-coat layer comprises inorganic-organic hybrid polymeric materials, or aliphatic or aromatic hexafunctional urethane acrylates.

* * * * *